United States Patent
Chang et al.

(10) Patent No.: US 7,352,636 B2
(45) Date of Patent: Apr. 1, 2008

(54) CIRCUIT AND METHOD FOR GENERATING BOOSTED VOLTAGE IN SEMICONDUCTOR MEMORY DEVICE

(75) Inventors: Soo-bong Chang, Seoul (KR); Chi-wook Kim, Hwaseong-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 11/313,722

(22) Filed: Dec. 22, 2005

(65) Prior Publication Data

US 2006/0146618 A1 Jul. 6, 2006

(30) Foreign Application Priority Data

Jan. 5, 2005 (KR) .................. 10-2005-0000802

(51) Int. Cl.
*G11C 5/14* (2006.01)
(52) U.S. Cl. .................. 365/189.09; 365/194
(58) Field of Classification Search ........... 365/189.09, 365/194
See application file for complete search history.

(56) References Cited

U.S. PATENT DOCUMENTS 5,867,442 A * 2/1999 Kim et al. .................. 365/226
6,973,007 B2 * 12/2005 Kim .................. 365/230.06
7,057,417 B2 * 6/2006 Okuno .................. 326/99
2004/0008558 A1 * 1/2004 Lee et al. .................. 365/222
2005/0232052 A1 * 10/2005 Jin .................. 365/226

FOREIGN PATENT DOCUMENTS

| JP | 2004-005773 | 1/2004 |
| KR | 100200721 B1 | 3/1999 |
| KR | 1020020053482 A | 7/2002 |

* cited by examiner

*Primary Examiner*—Amir Zarabian
*Assistant Examiner*—Anthan T Tran
(74) *Attorney, Agent, or Firm*—Volentine & Whitt, PLLC

(57) ABSTRACT

In a boosted voltage generating circuit of a semiconductor memory device, an active kicker drive signal generating circuit generates an active kicker drive signal having a first pulse duration in response to a row active command, and generates the active kicker drive signal having a second pulse duration in response to a refresh command. An active kicker circuit is responsive to the active kicker drive signal to generate the boosted voltage. The second pulse duration may be greater than the first pulse duration, which makes it possible to improve the pumping efficiency of the boosted voltage in a refresh operation.

9 Claims, 5 Drawing Sheets

CIRCUIT AND METHOD FOR GENERATING BOOSTED VOLTAGE IN SEMICONDUCTOR MEMORY DEVICE

BACKGROUND OF THE INVENTION

1. Field of the Invention

The present invention generally relates to semiconductor memory devices, and more particularly, the present invention relates to circuits and methods for generating a boosted voltage in a semiconductor memory device.

A claim of priority is made to Korean Patent Application No. 10-2005-0000802, filed on Jan. 5, 2005, in the Korean Intellectual Property Office, the disclosure of which is incorporated herein in its entirety by reference.

2. Description of the Related Art

Semiconductor memory devices generally include a circuit which generates a boosted voltage which is greater than a power supply voltage. The boosted voltage is supplied to activate a word line in the semiconductor memory device. The word line is activated during row activation and/or during a refresh operation. In the refresh operation, the word lines of all memory banks in the semiconductor memory device are activated, thus resulting in high consumption of the boosted voltage.

Accordingly, more word lines are activated during the refresh operation than during row activation, which can result in noise in the boosted voltage.

FIG. 1 is a block diagram of a conventional circuit which generates a boosted voltage VPP in a semiconductor memory circuit. The circuit of FIG. 1 includes an active kicker 140 and a circuit 100 which generates a signal for driving the active kicker 140. In general, the boosted voltage VPP is supplied to a word line driver (not shown) to maintain a voltage of an activated word line with the boosted voltage VPP.

The circuit 100 is an automatic pulse generator which includes a first NOR gate 110, a second NOR gate 120, and a delay circuit 130. The delay circuit 130 includes an odd number of inverters INV1, INV2, and INV3. When a row active command or a fresh command is input to the circuit 100, the circuit 100 generates an active kicker drive pulse signal AKE in response to an active signal ACT. The pulse duration of the active kicker drive pulse signal AKE is the same as an inverter delay time T1 in the delay circuit 130, illustrated in FIG. 2.

In response to the active kicker drive pulse signal AKE, the active kicker 140 generates the boosted voltage VPP. The active kicker 140 is a well-known pumping circuit, and thus, a detailed description thereof will be omitted.

FIG. 2 is a timing diagram of an active kicker drive pulse signal AKE generated during row activation by the conventional circuit illustrated in FIG. 1. Referring to FIG. 2, an active signal ACT is generated in a semiconductor memory device in response to a row active command 210 among external commands COMMAND input to the semiconductor memory device. When the active signal ACT is activated at a logic high level, the active kicker drive pulse signal AKE is activated from a logic low level to a logic high level. Each pulse of the active kicker drive pulse signal AKE is maintained for a delay time T1, and deactivated at a logic low level. The active kicker 140 of FIG. 1 generates the boosted voltage VPP for the delay time T1.

The active signal ACT is deactivated at a logic low level in response to a precharge command 220 among the external commands COMMAND. In FIG. 2, tRC denotes a row active cycle that is a total duration in which the row active command 210, the precharge command 220, and the next row active command 230 are sequentially input to the semiconductor memory device.

In general, a word line in the semiconductor memory device is activated and deactivated in association with the active signal ACT, and a word line is activated during the row active cycle tRC. A pulse duration of the active kicker drive pulse signal AKE is designed to supply the boosted voltage VPP which is sufficient to activate a word line.

FIG. 3 is a timing diagram of an active kicker drive pulse signal AKE generated during a refresh operation by the conventional circuit of FIG. 1. Referring to FIG. 3, a refresh signal REF is generated in a semiconductor memory device in response to a refresh command 300 among external commands COMMAND input to the semiconductor memory device. When the refresh signal REF is activated at a logic high level, a refresh counter in the semiconductor memory device operates to sequentially generate cycle signals. The active signal ACT is activated in response to each of the cycle signals and deactivated after a predetermined length of time. The activation of the active signal ACT results in activation of the active kicker drive pulse signal AKE at a logic low level to a logic high level.

As illustrated in FIG. 2, during row activation, pulses of the active kicker drive pulse signal AKE are sequentially generated since the row active command 210 and the precharge command 229 are sequentially and individually input to the semiconductor memory device. In contrast, referring to FIG. 3, during the refresh operation, when the refresh command 300 is input to the semiconductor memory device, a refresh counter (not shown) in the semiconductor memory device activates each word line sequentially and repeatedly for a predetermined time, i.e., a refresh cycle tRFC. Each pulse of the active kicker drive pulse signal AKE is maintained for a delay time T1 during the refresh cycle tRFC. The refresh cycle tRFC is longer than the row active cycle tRC of FIG. 2.

When word lines in all memory banks are simultaneously activated during the refresh operation, a large amount of the boosted voltage VPP is consumed and a peak noise occurs in the boosted voltage VPP. The peak noise degrades the efficiency of a pumping circuit, such as an active kicker, which generates the boosted voltage VPP and may cause the refresh operation to be unstably performed.

A conventional circuit which generates a boosted voltage as illustrated in FIG. 1 generates an active kicker drive pulse signal AKE in both row activation and the refresh operation, and thus, there is a limit to improving the pumping efficiency of the circuit during the refresh operation.

SUMMARY OF THE INVENTION

According to one aspect of the present invention, there is provided a circuit which generates a boosted voltage in a semiconductor memory device, the circuit comprising an active kicker drive signal generating circuit which generates an active kicker drive signal having a first pulse duration in response to a row active command, and the active kicker drive signal having a second pulse duration in response to a refresh command. The circuit further includes an active kicker which generates the boosted voltage in response to the active kicker drive signal.

The second pulse duration may be greater than the first pulse duration.

The active kicker drive signal generating circuit may include a first path along which the active kicker drive signal having the first pulse duration is output in response to the row active command, and a second path along which the active kicker drive signal having the second pulse duration is output in response to the refresh command. An automatic pulse generating unit may be installed in the first path. The automatic pulse generating unit may include a delay circuit, and the delay circuit may include an odd number of inverters. An automatic pulse generating unit is installed in the second path, and this automatic pulse generating unit may include a first delay circuit and a second delay circuit. The first delay circuit may include an odd number of inverters, and the second delay circuit may include an even number of inverters.

According to another aspect of the present invention, there is provided a method of generating a boosted voltage using a boosted voltage generating circuit which includes an active kicker which generates the boosted voltage in response to an active kicker drive signal. The method includes generating the boosted voltage by generating the active kicker drive signal having a first pulse duration during row activation and driving the active kicker in response to the active kicker drive signal having the first pulse duration, and generating the boosted voltage by generating the active kicker drive signal having a second pulse duration in a refresh operation and driving the active kicker in response to the active kicker drive signal having the second pulse duration.

Again, the second pulse duration may be greater than the first pulse duration.

BRIEF DESCRIPTION OF THE DRAWINGS

The above and other aspects and advantages of the present invention will become readily apparent from the detailed description that follows, with reference to the accompanying drawings, in which.

DETAILED DESCRIPTION OF PREFERRED EMBODIMENTS

Figure 1:
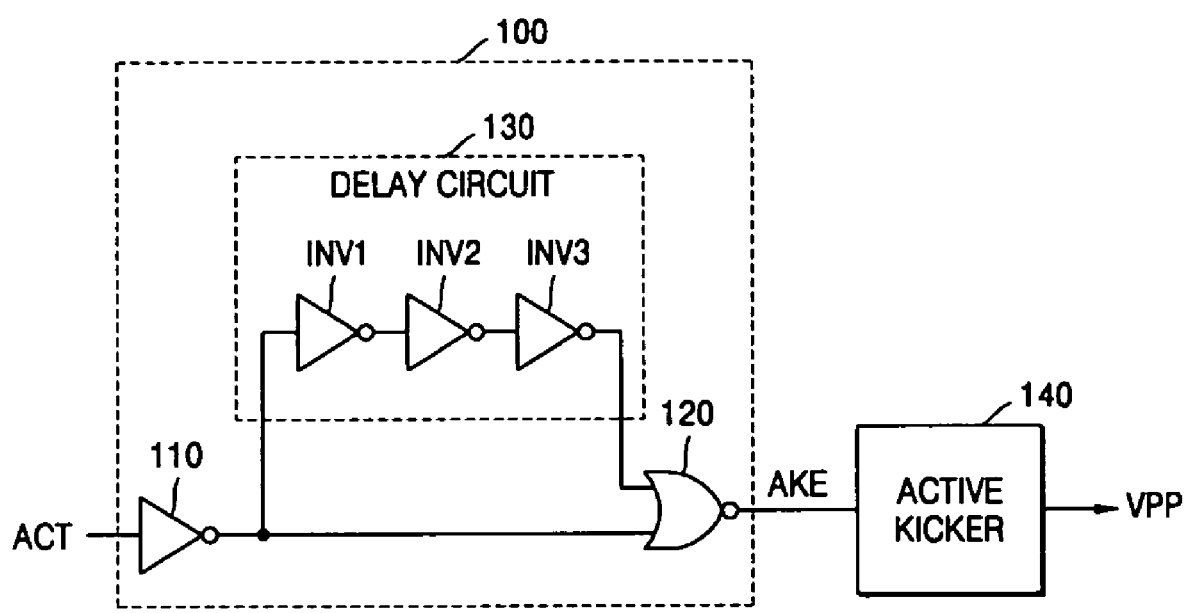
FIG. 1 is a block diagram of a conventional circuit which generates a boosted voltage.
Figure 2:
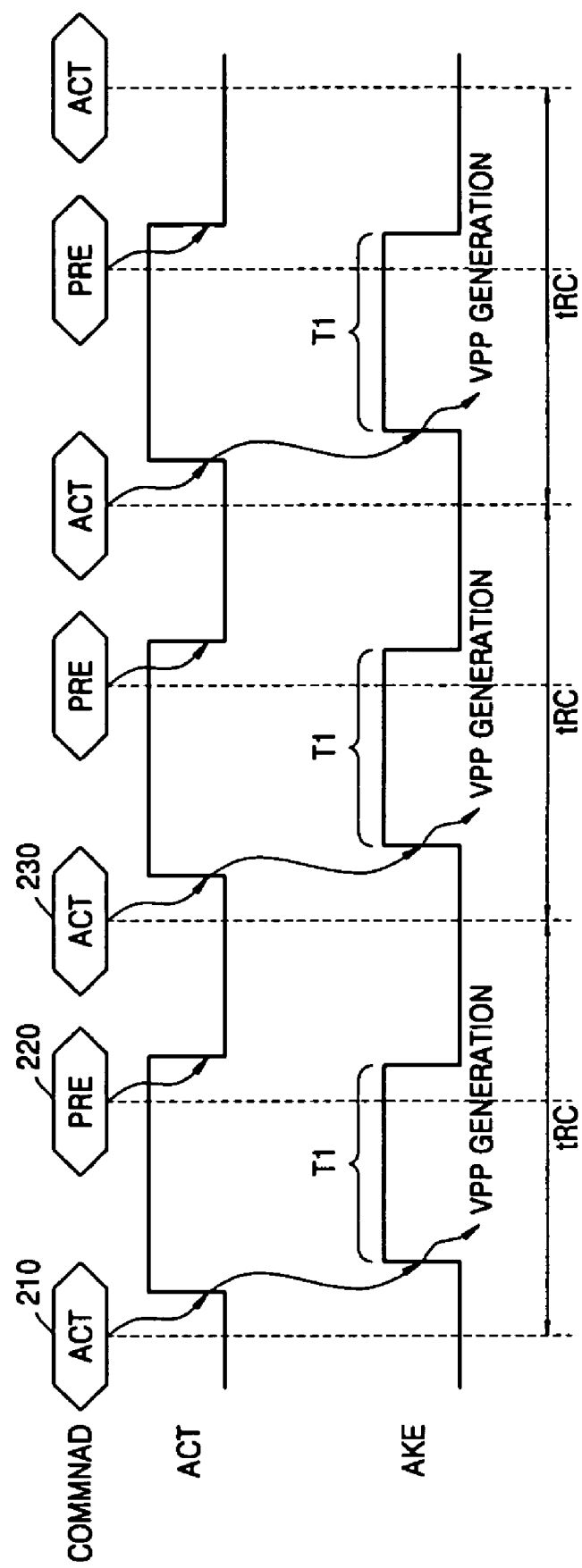
FIG. 2 is a timing diagram of an active kicker drive pulse signal generated in row activation by the conventional circuit illustrated in FIG. 1.
Figure 3:
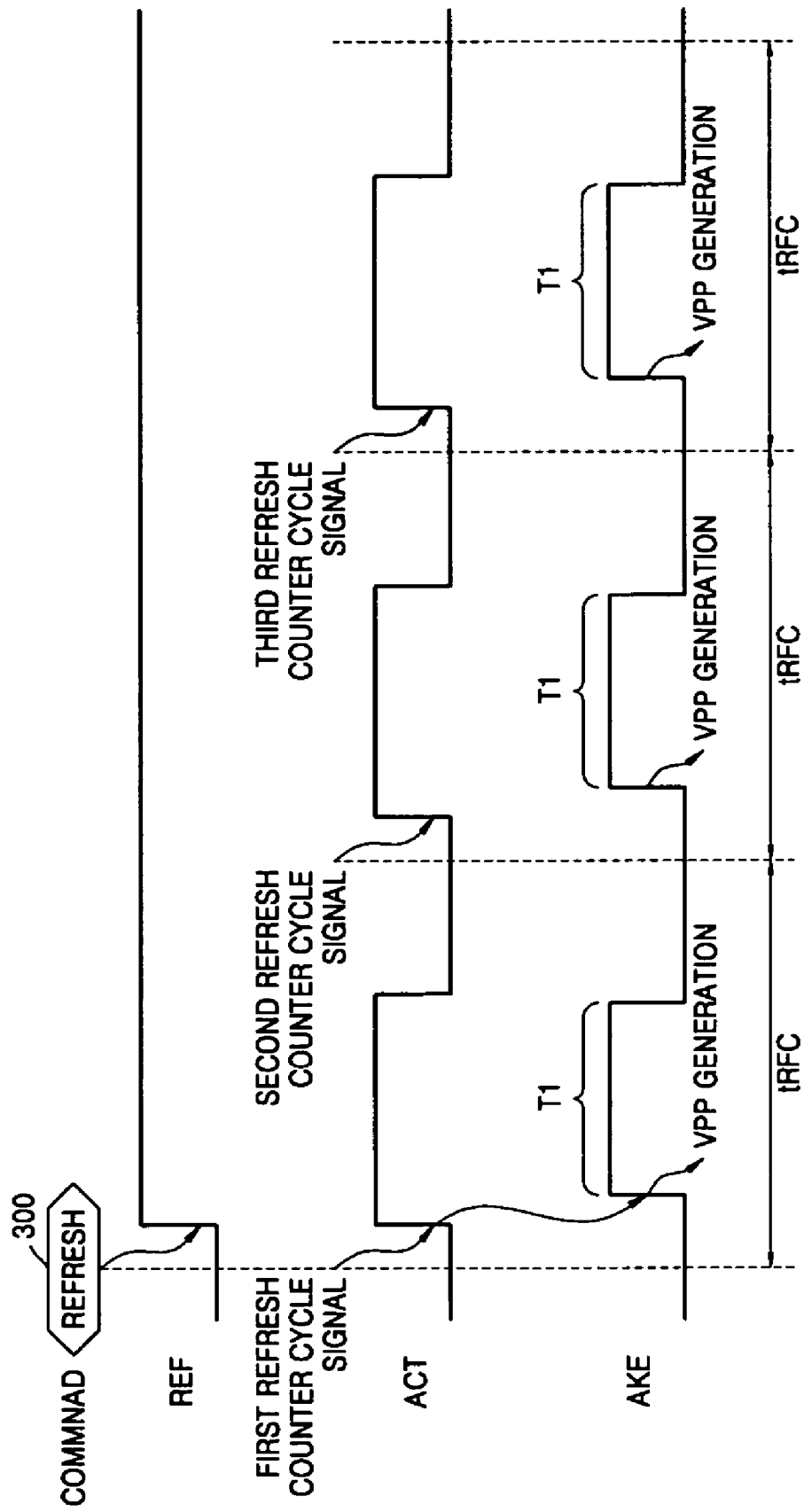
FIG. 3 is a timing diagram of an active kicker drive pulse signal generated in a refresh operation by the conventional circuit illustrated in FIG. 1.

Hereinafter, an exemplary embodiment of the present invention will be described in detail with reference the accompanying drawings. Like reference numerals are used to designate like or equivalent elements throughout this disclosure.

Figure 4:
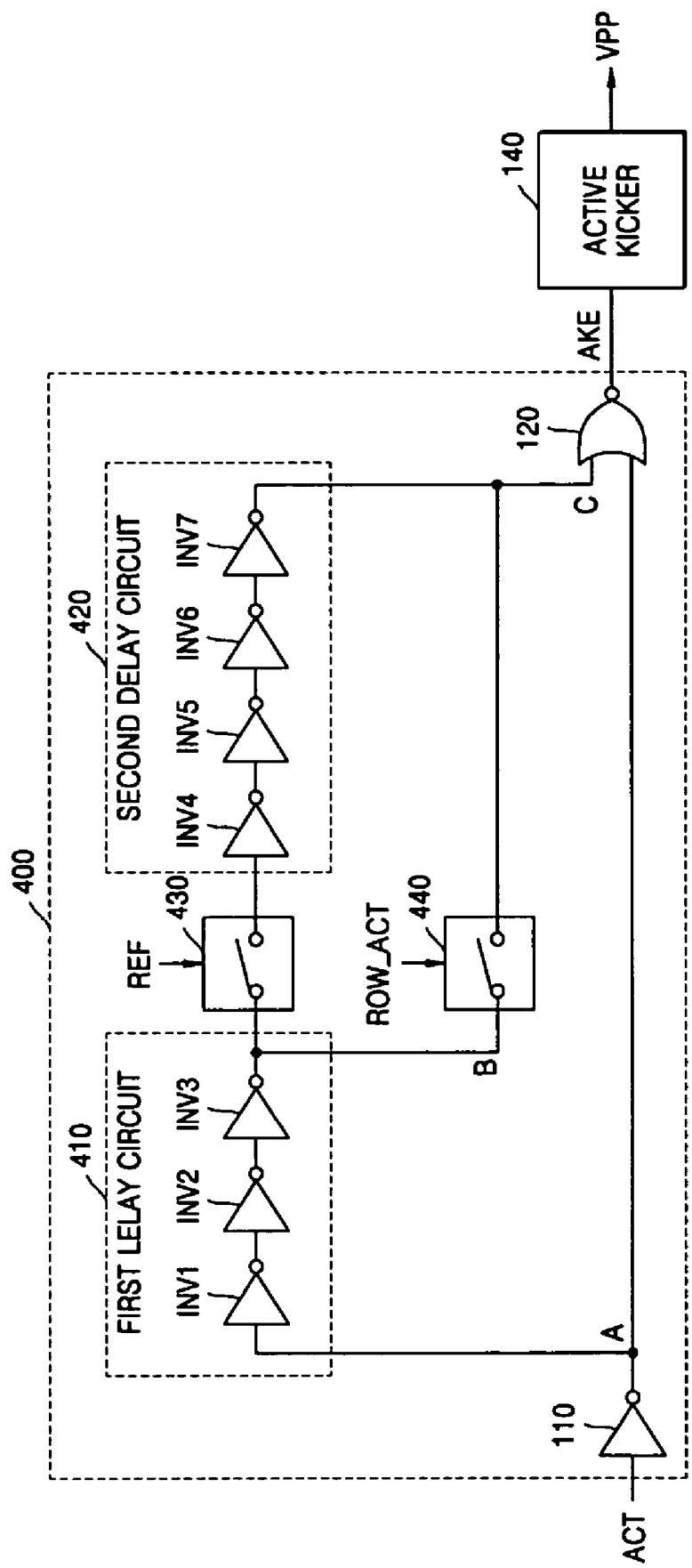
FIG. 4 is a block diagram of a circuit which generates a boosted voltage according to an embodiment of the present invention.

FIG. 4 is a block diagram of a circuit which generates a boosted voltage according to an embodiment of the present invention. The circuit includes a circuit 400 which generates an active kicker drive pulse signal, and an active kicker 140. The circuit 400 includes a first path (110, 410, 440, and 120), and a second path (110, 410, 430, 420, and 120).

The first path is a path along which an active kicker drive pulse signal AKE is generated during row activation. The second path is a path along which the active kicker drive pulse signal AKE is generated during a refresh operation. An inverter 110, a first delay circuit 410, a first switch 440, and an NOR gate 120 are installed in the first path. The inverter 110, the first delay circuit 410, a second switch 430, a second delay circuit 420, and the NOR gate 120 are installed in the second path.

In the example of this embodiment, in the row activation and the refresh operation of a semiconductor memory device, an active signal ACT is activated from a logic low level to a logic high level. A method of changing a pulse duration of the active kicker drive pulse signal AKE in the row activation and the refresh operation according to an embodiment of the present invention will now be described.

In the row activation, the active signal ACK is activated, and then, the level of an output terminal A of the inverter 110 is changed from a logic high level to a logic low level. The level of an input terminal A of the NOR gate 120 is initially set to a logic low level, and thus, the level of its output terminal AKE is changed from a logic low level to a logic high level. Thus, the active kicker 140 is driven in response to the activated active kicker drive pulse signal AKE, thus generating a boosted voltage VPP. When the logic low level of the output terminal A of the inverter 110 is input to the first delay circuit 140, the level of an output terminal B of the first delay circuit 410 is changed to a logic high level. The second switch 430 is open when a refresh signal REF is activated in the refresh operation, and the first switch 440 is open when a row active signal ROW_ACT is activated in the row activation. In the row activation, only the first switch 440 is open, and therefore, the logic high level of the output terminal B of the first delay circuit 410 is input directly to a node C. In this case, the output terminal AKE of the NOR gate 120 is deactivated again and the active kicker 140 stops generating the boosted voltage VPP.

As described above, in the row activation, the active kicker drive pulse signal AKE is activated for a delay time T1 of the first delay circuit 410, thus driving the active kicker 140.

In other words, in the row activation, the first switch 440 is turned on, and the pulse duration of the active kicker pulse drive signal AKE becomes equal to the delay time T1 of the first delay circuit 410. In the refresh operation, the second switch is turned on, and the pulse duration of the active kicker drive pulse signal AKE becomes equal to the sum of the delay time T1 of the first delay circuit 410 and a delay time T2 of the second delay circuit 420. The active kicker 140 is a general pumping circuit which is well known to those ordinarily skilled in the art, and thus, a detailed description thereof is omitted here.

Figure 5:
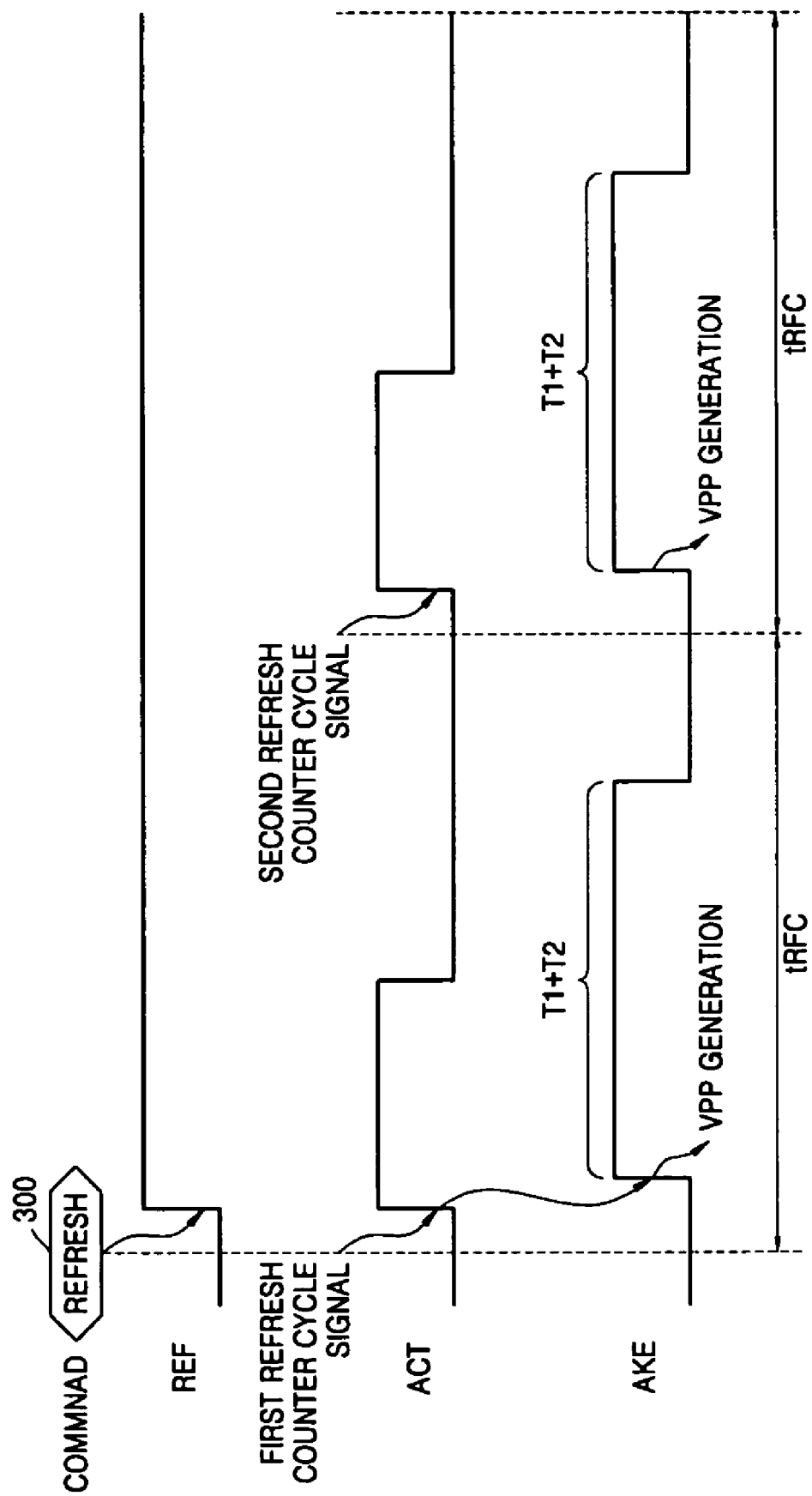
FIG. 5 is a timing diagram of an active kicker drive pulse signal generated in a refresh operation by the circuit illustrated in FIG. 4 according to an embodiment of the present invention.

FIG. 5 is a timing diagram of an active kicker drive pulse signal AKE generated by the circuit illustrated in FIG. 4 in the refresh operation, according to an embodiment of the present invention. A refresh signal REF is generated in a semiconductor memory device in response to a refresh command 300 among external commands COMMAND input to the semiconductor memory device. In the refresh operation, a refresh counter sequentially activates cycle signals, and an active signal ACT is activated in response to each cycle signal. When the active signal ACT is activated to a logic high level, the active kicker drive pulse signal AKE is also activated from a logic low level to a logic high level.

As described with reference to FIG. 4, a pulse duration of the active kicker drive pulse signal AKE is the same as the sum of the delay times T1 and T2 of the first and second delay circuits 420. In this case, since the duration of a refresh cycle tRFC is greater than that of a row active cycle tRC, the active kicker drive pulse signal AKE is activated. While the active kicker drive pulse signal AKE is activated for the sum of the delay times T1 and T2, the active kicker 140 is activated to generate a boosted voltage VPP, thereby improving the pumping efficiency of the circuit which generates the boosted voltage VPP in the refresh operation.

While this invention has been particularly shown and described with reference to exemplary embodiments thereof, it will be understood by those skilled in the art that various changes in form and details may be made therein without departing from the spirit and scope of the invention as defined by the appended claims. For instance, the active kicker drive pulse signal AKE with at least two pulses may be generated and input to the active kicker 140 during the refresh cycle tRFC. Instead of the row active signal ROW_ACT, an inversion signal of the refresh signal REF, which is input to the second switch 430, may be input to the first switch 440. That is, the refresh signal REF is input to the first switch 440 and an inverted refresh signal REFB is input to the second switch 430. Also, it is possible to generate a sufficient amount of the boosted voltage VPP by controlling the active kicker drive pulse signal to be delayed for a long time only in the refresh operation.

As described above, in a circuit and method for generating a boosted voltage according to the present invention, the pumping efficiency of the boosted voltage is improved by increasing the duration that an active kicker is activated in a refresh operation.

What is claimed is:

1. A circuit which generates a boosted voltage in a semiconductor memory device, comprising:
    an active kicker drive signal generating circuit which generates an active kicker drive signal having a first pulse duration in response to a row active command, and which generates the active kicker drive signal having a second pulse duration in response to a refresh command; and
    an active kicker generating circuit which generates the boosted voltage in response to the active kicker drive signal;
    wherein the second pulse duration is greater than the first pulse duration, and
    wherein the active kicker drive signal generating circuit comprises a first delay circuit and a second delay circuit which are selectively connected in series in response to the refresh command.

2. The circuit of claim 1, wherein the active kicker drive signal generating circuit comprises:
    a first path, which includes the first delay circuit, along which the active kicker drive signal having the first pulse duration is output in response to the row active command; and
    a second path, which includes the first and second delay circuits connected in series, along which the active kicker drive signal having the second pulse duration is output in response to the refresh command.

3. The circuit of claim 2, wherein the first delay circuit comprises an odd number of inverters, and the second delay circuit comprises an even number of inverters.

4. The circuit of claim 1, wherein the row active command is an inverted refresh command.

5. A method of generating a boosted voltage during a row activation operation and a refresh operation of a semiconductor memory device, wherein the boosted voltage is generated using a boosted voltage generating circuit which includes an active kicker circuit which generates the boosted voltage in response to an active kicker drive signal, the method comprising:
    generating the active kicker drive signal having a first pulse duration using a first delay circuit during the row activation operation and driving the active kicker circuit of the boosted voltage generating circuit in response to the active kicker drive signal having the first pulse duration; and
    generating the active kicker drive signal having a second pulse duration using the first delay circuit connected in series with a second delay circuit during the refresh operation and driving the active kicker circuit of the boosted voltage generating circuit in response to the active kicker drive signal having the second pulse duration, wherein the second pulse duration is greater than the first pulse duration.

6. A circuit which generates a boosted voltage in a semiconductor memory device, comprising:
    an active kicker drive signal generating circuit which receives an active command signal, a row active command signal, and a refresh command signal, and which generates an active kicker drive signal; and
    an active kicker generating circuit which generates the boosted voltage in response to the active kicker drive signal;
    wherein the active kicker drive signal is enabled in response to the active command signal,
    wherein an enabled pulse duration of the active kicker drive signal is a first pulse duration when the row active command signal is enabled, and a second pulse duration when the refresh command signal is enabled, and
    wherein the second pulse duration is greater than the first pulse duration.

7. The circuit of claim 6, wherein the active kicker drive signal generating circuit comprises:
    an input which receives the active command signal;
    an output which outputs the active kicker drive signal;
    a first delay circuit; and
    a second delay circuit;
    wherein the first delay circuit is connected between the input and the output in response to the row active command signal, and
    wherein the first delay circuit and the second delay circuit are connected in series between the input and output in response to the refresh command signal.

8. The circuit of claim 7, wherein the active kicker drive signal generating circuit comprises:
    a first switch which is driven by the refresh command signal and which is connected between an output of the first delay circuit and an input of the second delay circuit; and
    a second switch which is driven by the row active command signal and which is connected between the output of the first delay circuit and the output of the active kicker drive signal generating circuit.

9. The circuit of claim 7, wherein the first delay circuit comprises an odd number of inverters, and the second delay circuit comprises an even number of inverters.

* * * * *